United States Patent
Cheah et al.

(10) Patent No.: US 11,652,026 B2
(45) Date of Patent: May 16, 2023

(54) MICRO THROUGH-SILICON VIA FOR TRANSISTOR DENSITY SCALING

(71) Applicant: Intel Corporation, Santa Clara, CA (US)

(72) Inventors: Bok Eng Cheah, Geulgor (MY); Choong Kooi Chee, Gelugor (MY); Jackson Chung Peng Kong, Tanjung Tokong (MY); Wai Ling Lee, Bayan Lepas (MY); Tat Hin Tan, Gelugor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/587,647

(22) Filed: Jan. 28, 2022

(65) Prior Publication Data

US 2022/0157694 A1 May 19, 2022

Related U.S. Application Data (63) Continuation of application No. 17/155,757, filed on Jan. 22, 2021, now Pat. No. 11,393,741, which is a
(Continued)

(30) Foreign Application Priority Data

Jul. 31, 2018 (MY) .......................... PI-2018702670

(51) Int. Cl.
*H01L 21/00* (2006.01)
*H01L 23/48* (2006.01)
(Continued)

(52) U.S. Cl.
CPC ...... *H01L 23/481* (2013.01); *H01L 21/76898* (2013.01); *H01L 21/8221* (2013.01);
(Continued)

(58) Field of Classification Search
CPC ............. H01L 23/481; H01L 21/76898; H01L 21/8221
See application file for complete search history.

(56) References Cited

U.S. PATENT DOCUMENTS 5,229,647 A * 7/1993 Gnadinger .............. H01L 24/72
257/785
6,812,549 B2 11/2004 Umetsu et al.
(Continued)

OTHER PUBLICATIONS

Office Action from U.S. Appl. No. 16/402,482, dated Apr. 3, 2020, 10 pgs.
(Continued)

*Primary Examiner* — Laura M Menz
(74) *Attorney, Agent, or Firm* — Schwabe, Williamson & Wyatt, P.C.

(57) ABSTRACT

An electronic device comprises an integrated circuit (IC) die. The IC die includes a first bonding pad surface and a first backside surface opposite the first bonding pad surface; a first active device layer arranged between the first bonding pad surface and the first backside surface; and at least one stacked through silicon via (TSV) disposed between the first backside surface and the first bonding pad surface, wherein the at least one stacked TSV includes a first buried silicon via (BSV) portion having a first width and a second BSV portion having a second width smaller than the first width, and wherein the first BSV portion extends to the first backside surface and the second BSV portion extends to the first active device layer.

20 Claims, 9 Drawing Sheets

Related U.S. Application Data continuation of application No. 16/402,482, filed on May 3, 2019, now Pat. No. 10,903,142.

(51) Int. Cl.
    *H01L 25/16*      (2023.01)
    *H01L 23/00*      (2006.01)
    *H01L 21/768*      (2006.01)
    *H01L 21/822*      (2006.01)
    *H01L 49/02*      (2006.01)

(52) U.S. Cl.
    CPC .............. *H01L 24/09* (2013.01); *H01L 24/17* (2013.01); *H01L 25/16* (2013.01); *H01L 28/40* (2013.01)

(56) References Cited

U.S. PATENT DOCUMENTS

| | | | |
|---|---|---|---|
| 6,873,054 B2* | 3/2005 | Miyazawa | H01L 21/76898 257/667 |
| 7,692,278 B2* | 4/2010 | Periaman | H01L 25/0652 257/758 |
| 8,044,497 B2* | 10/2011 | Cheah | H01L 23/481 257/777 |
| 8,110,930 B2* | 2/2012 | Periaman | H01L 25/0657 257/772 |
| 8,198,617 B2 | 2/2012 | Georgeson et al. | |
| 8,198,716 B2* | 6/2012 | Periaman | H01L 25/18 257/E21.597 |
| 8,466,059 B2* | 6/2013 | Chang | H01L 21/6835 257/E21.585 |
| 8,513,119 B2* | 8/2013 | Chang | H01L 25/50 257/E21.585 |
| 8,697,495 B2 | 4/2014 | Cheah et al. | |
| 8,791,549 B2* | 7/2014 | Chen | H01L 21/76813 257/621 |
| 8,900,994 B2* | 12/2014 | Yu | H01L 21/76871 257/621 |
| 10,163,756 B2* | 12/2018 | Chang | H01L 24/13 |
| 10,903,142 B2* | 1/2021 | Cheah | H01L 24/09 |
| 2008/0315433 A1* | 12/2008 | Chen | H01L 24/81 257/E23.141 |
| 2010/0007001 A1* | 1/2010 | Wang | H01L 25/0657 257/E21.705 |
| 2010/0148371 A1* | 6/2010 | Kaskoun | H01L 23/481 257/777 |
| 2010/0258917 A1* | 10/2010 | Lin | H01L 21/76898 257/E21.597 |
| 2012/0018868 A1* | 1/2012 | Oganesian | H01L 24/03 257/E25.023 |
| 2017/0040253 A1* | 2/2017 | Kim | G02F 1/13 |
| 2018/0053748 A1* | 2/2018 | Lu | H01L 24/89 |
| 2018/0145030 A1* | 5/2018 | Beyne | H01L 23/5283 |
| 2020/0043831 A1* | 2/2020 | Cheah | H01L 25/0657 |
| 2020/0091040 A1* | 3/2020 | Cheah | H01L 21/76898 |
| 2020/0126920 A1* | 4/2020 | Huang | H01L 27/14621 |
| 2020/0168528 A1* | 5/2020 | Cheah | H01L 23/5383 |
| 2020/0303361 A1* | 9/2020 | Shih | H01L 25/50 |
| 2021/0320051 A1* | 10/2021 | Cheah | H01L 21/8221 |
| 2022/0157694 A1* | 5/2022 | Cheah | H01L 25/50 |

OTHER PUBLICATIONS

Notice of Allowance from U.S. Appl. No. 16/402,482, dated Sep. 22, 2020, 5 pgs.

Office Action from U.S. Appl. No. 17/155,757, dated Dec. 23, 2021, 8 pgs.

Notice of Allowance from U.S. Appl. No. 17/155,757, dated Mar. 30, 2022, 9 pgs.

Office Action for Malaysian Application No. PI2018702670 dated Oct. 29, 2021, 3 pgs.

\* cited by examiner

MICRO THROUGH-SILICON VIA FOR TRANSISTOR DENSITY SCALING

PRIORITY APPLICATION

This application is a continuation of U.S. patent application Ser. No. 17/155,757, filed Jan. 22, 2021, which is a continuation of U.S. patent application Ser. No. 16/402,482, filed May 3, 2019, now U.S. Pat. No. 10,903,142, issued Jan. 26, 2021, which claims the benefit of priority to Malaysian Application Serial Number PI 2018702670, filed Jul. 31, 2018, all of which are incorporated herein by reference in their entirety.

TECHNICAL FIELD

Embodiments pertain to packaging of integrated circuits (ICs). Some embodiments relate to IC package interconnection of integrated circuits.

BACKGROUND

Electronic systems often include integrated circuits (ICs) that are connected to a subassembly such as a substrate or motherboard. As electronic system designs become more complex, it is a challenge to route the desired interconnection of the ICs of the systems. One aspect that influences the overall size of a design is the size and spacing required for the interconnection of the ICs. As the spacing is reduced to meet performance goals, the electronic system can become less robust. Thus, there are general needs for devices, systems and methods that address the spacing challenges for routing of system interconnection yet provide a robust and cost effective design.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

To meet the demand for increased functional complexity in smaller devices, through-silicon vias (TSVs) can be used to route signal interconnect vertically in IC die. However, current manufacturing processes for TSVs require a large keep-out-region (KOR) to provide clearance between the TSVs and transistor devices in silicon substrates. The KOR is necessary to prevent transistor functionality breakdown due to thermo-mechanical stress. The KOR requirement for TSVs can be significant and can reduce the total area available for transistor placement in an IC. This can impose undesirable constraints on transistor density scaling, but reducing the KOR can poses risks of transistor performance degradation due to the undesirable mechanical stress. This is particularly more pronounced if the TSVs are copper-based because copper has a significantly different coefficient of thermal expansion (CTE) compared to silicon.

Figure 1:
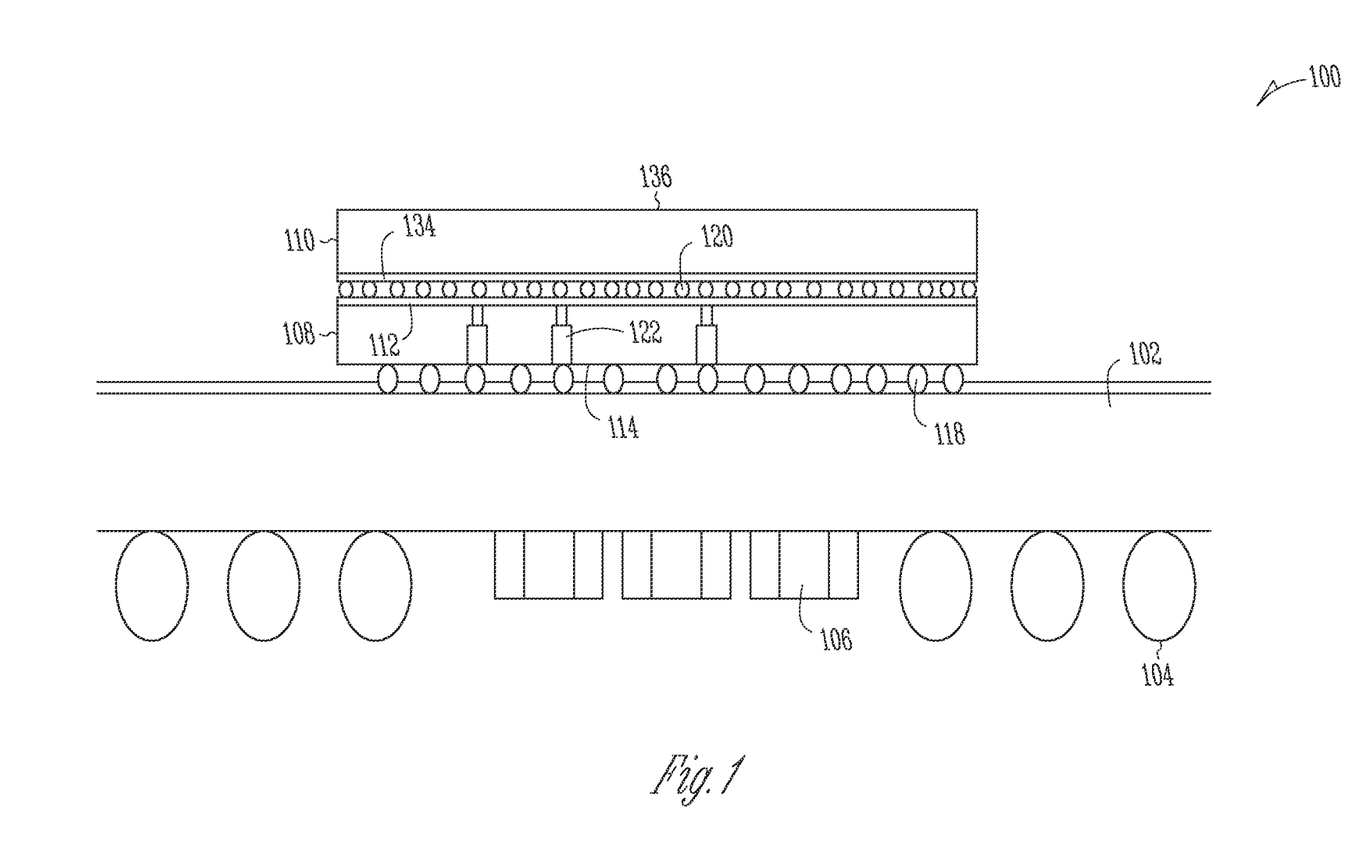
FIG. 1 is an illustration of a three-dimensional (3D) integrated circuit (IC) package in accordance with some embodiments.

FIG. 1 is an illustration of a three-dimensional (3D) IC package 100. The IC package includes a multi-layer package substrate 102. The IC package includes solder balls 104, one or more passive electronic components 106 (e.g., capacitors), a first or base IC die 108, and a second IC die 110. The IC dies can include, among other things, one or more of a central processor unit (CPU), a platform controller hub (PCH) chipset, dynamic random access memory (DRAM), and a field programmable gate array (FPGA).

The base IC die 108 includes a bonding pad surface 112 and a backside surface 114 opposite the bonding pad surface 112. The backside surface 114 may have been the backside of a silicon wafer before the fabricated ICs were separated into die. The backside surface 114 includes package solder bumps 118 for coupling to the multi-layer package substrate 102 and providing continuity to the interconnect between the multi-layer package substrate 102 and the base IC die 108. The bonding pad surface includes micro solder bumps 120 for coupling the IC die and for providing continuity to the interconnect between the IC die. The base IC die 108 also includes multiple stacked TSVs 122.

Figure 2A:
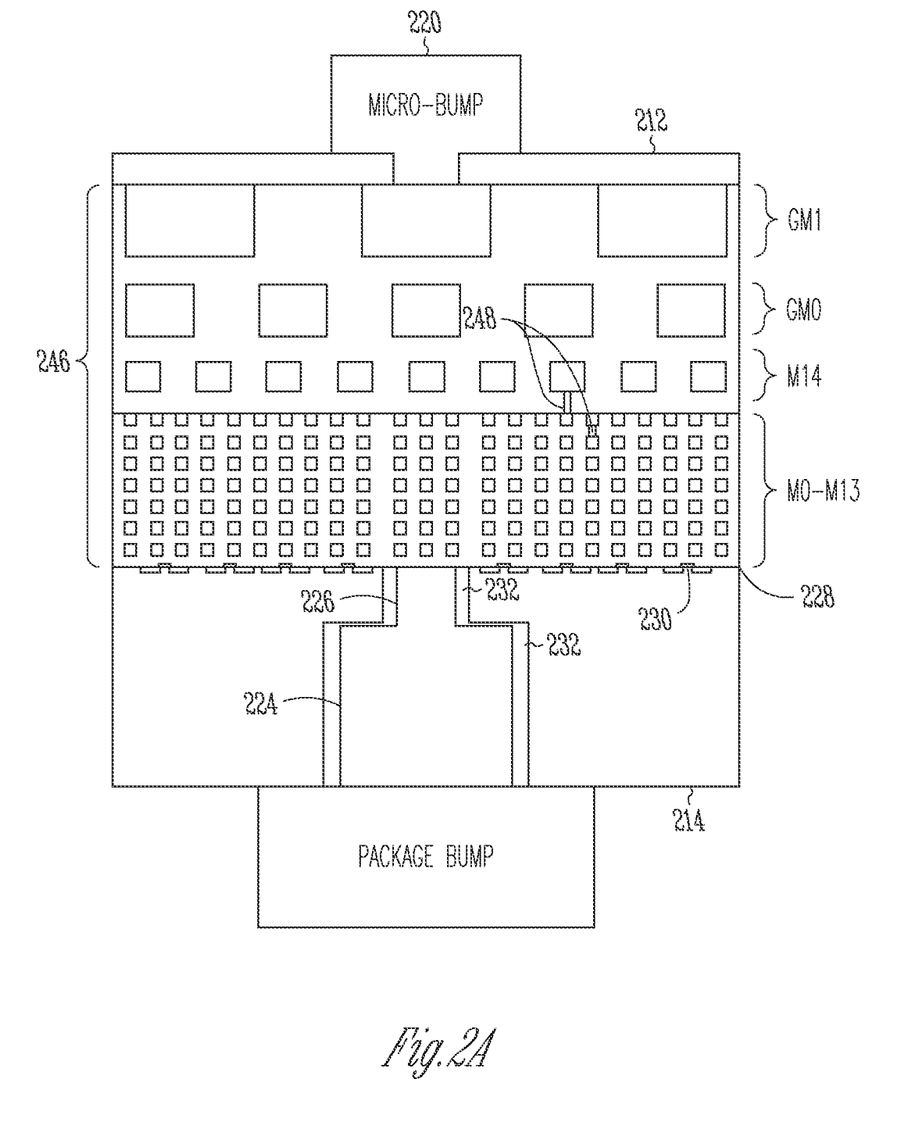
FIGS. 2A and 2B are blowup illustrations of a portion of the base IC die of FIG. 1 including a stacked through silicon via (TSV) in accordance with some embodiments.
Figure 2B:
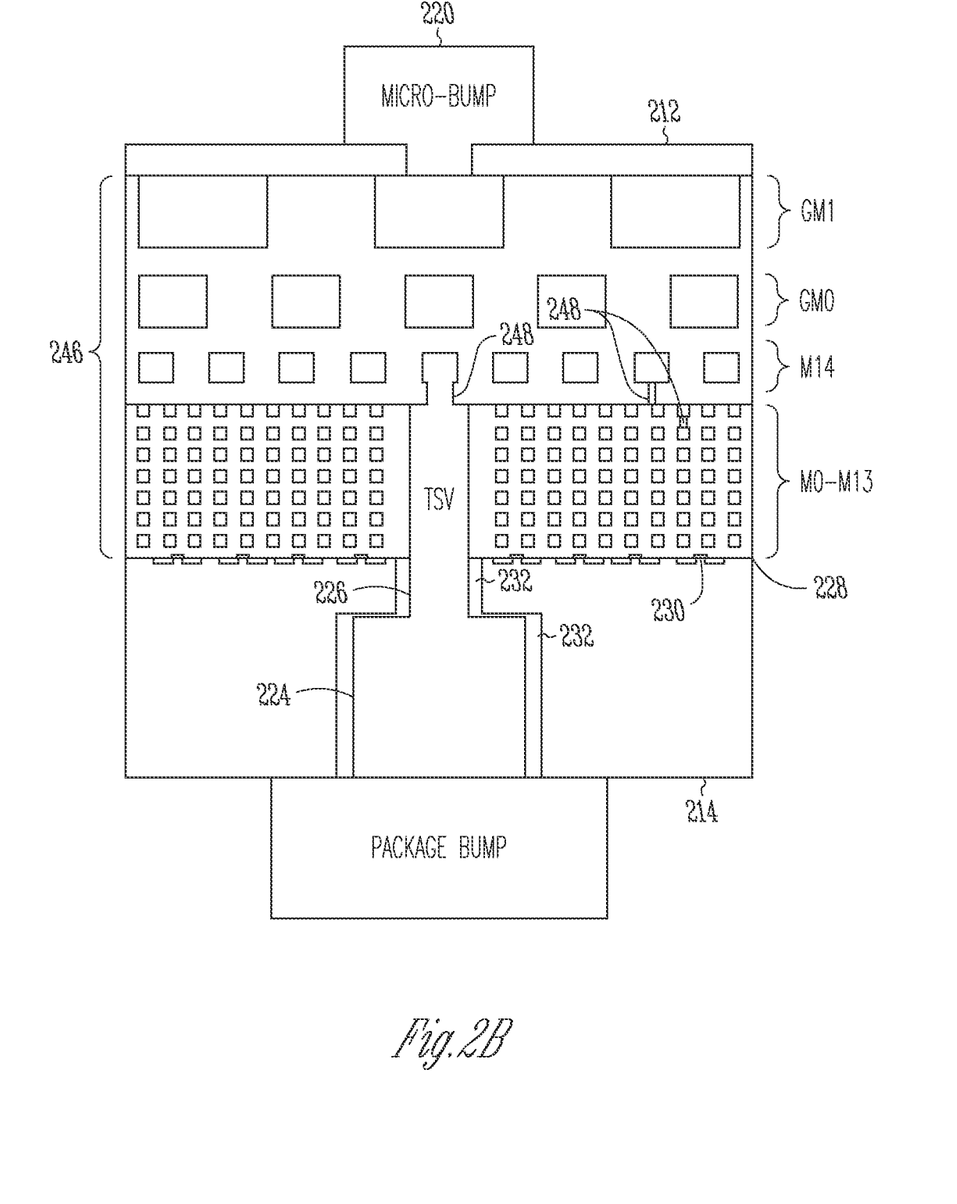

FIGS. 2A and 2B are blowup illustrations of a portion of the base IC die 108 of FIG. 1 including a stacked TSV. The stacked TSV includes a first buried silicon via (BSV) portion 224 and a second BSV portion 226. The two BSVs combine to form the stacked TSV. The stacked TSV extends between the backside surface 214 and the bonding pad surface 212 of the IC die. In the example of FIGS. 2A and 2B, the first BSV portion 224 extends to the first backside surface 214.

FIGS. 2A and 2B also show an active device layer 228 that includes transistor devices 230. The second BSV portion 226 has a width smaller than the width of the first BSV portion 224. KOR 232 separates the second BSV portion 226 and the active device layer 228. Because the second BSV portion has a smaller width, more active devices (e.g., transistors) can be fabricated in the active device layer than if the stacked TSV had a uniform width of the first BSV portion 224.

The multi-width solution shown in FIGS. 2A and 2B is more desirable than merely making the entire stacked TSV with the smaller width. An IC manufacturing process typically places an aspect ratio threshold of TSV width and height (e.g., width:height aspect ratio of 1:10) in order to reliably fabricate TSVs. Uniformly reducing the width also reduces the height, which limits the thickness of the IC substrate in order for the TSV to reach the desired locations in the IC. Limiting the thickness of the silicon substrate increases the challenges of silicon substrate warpage and thermal dissipation in the ICs. The multi-width solution relaxes the aspect ratio limit compared to the uniformly thinner TSV solution.

FIGS. 2A and 2B further show a stack of metal and via layers 246 disposed above the active device layer 228. The Figures include representations for metal layers M0-M14, giant metal layers GM0 and GM1, and vias 248. In FIG. 2A, the stacked TSV only extends to the active device layer 228. In FIG. 2B, the stacked TSV extends into the metal and via layers 246 and lands on metal interconnect layer 14 (M14), but the stacked TSV can land on any of the metal layers. The second BSV portion 226 can also be in electrical contact with the bonding pad surface 212. In some aspects, the second BSV portion 226 can extend to the bonding pad surface 212 of the IC die. In some aspects, the second BSV portion 226 interconnects with a metal layer or bonding pad adjacent the micro solder bump 220. In some aspects, the second BSV portion 226 is electrically connected to transistors arranged in the active device layer 228 through the metal and via layers 246. The width of the first BSV portion 224 can correspond to a feature pitch size of the backside surface 214, and the width of the second BSV portion 226 can correspond to a feature pitch size of the active device layer 228 or the metal and via layers 246.

Returning to FIG. 1, the second IC die 110 includes a bonding pad surface 134 and a backside surface 136 opposite the bonding pad surface 134. The second IC die is arranged on the first IC die with the bonding pad surface 134 of the second IC die facing the bonding pad surface 112 of the first IC die. The stacked TSV 122 and micro solder bumps 120 can provide electrical continuity between the multi-layer substrate 102 and the bonding pad surface 134 of the second IC die.

Figure 3:
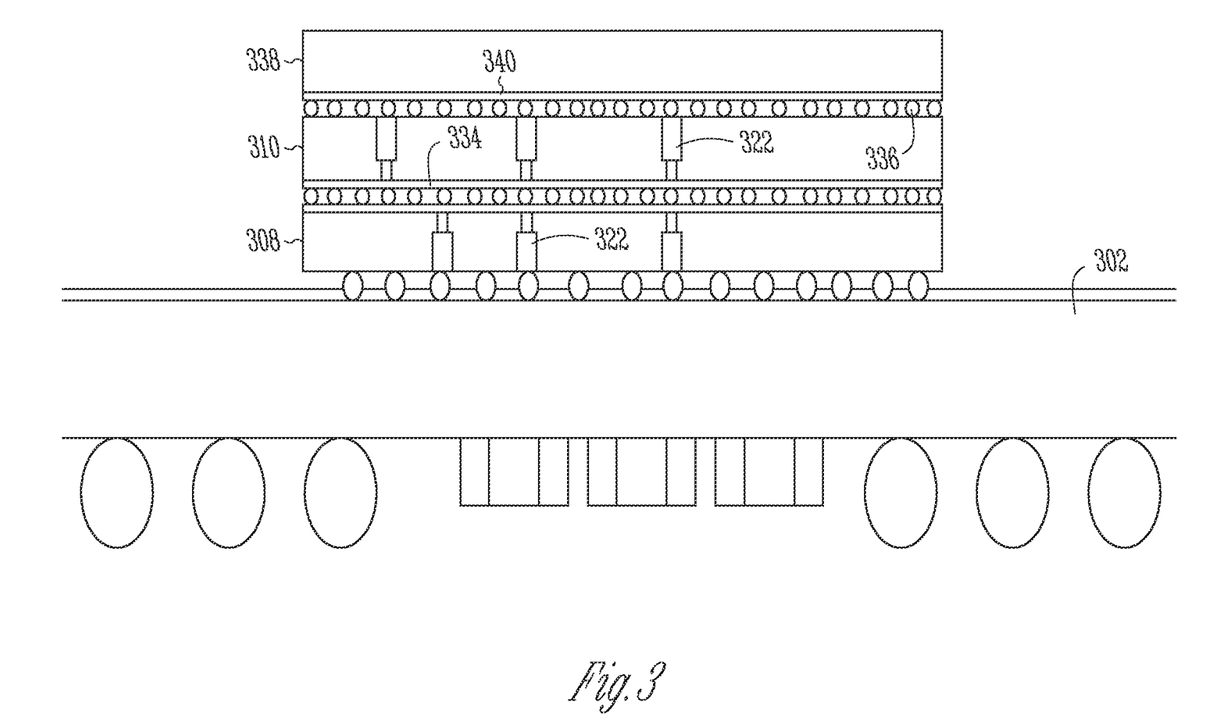
FIG. 3 is an illustration of another 3D IC package in accordance with some embodiments.

The concepts shown in FIGS. 1 and 2 can be extended. FIG. 3 is an illustration of another three-dimensional (3D) IC package 300. The IC package 300 includes a package substrate 302, a base IC die 308, a second IC die 310, and a third IC die 338. The third IC die 338 includes a bonding pad surface 340 that is coupled by solder bumps (e.g., micro solder bumps) to the backside surface 336 of the second IC die.

The base IC die 308 includes at least one stacked TSV 322, and the second IC die 310 includes at least one stacked TSV 322 extending between the backside surface 336 and the bonding pad surface 334 of the second IC die. The stacked TSVs include a first BSV portion that extends to the second backside surface and a second BSV portion that has a width smaller than a width of the first BSV portion.

Figure 4:
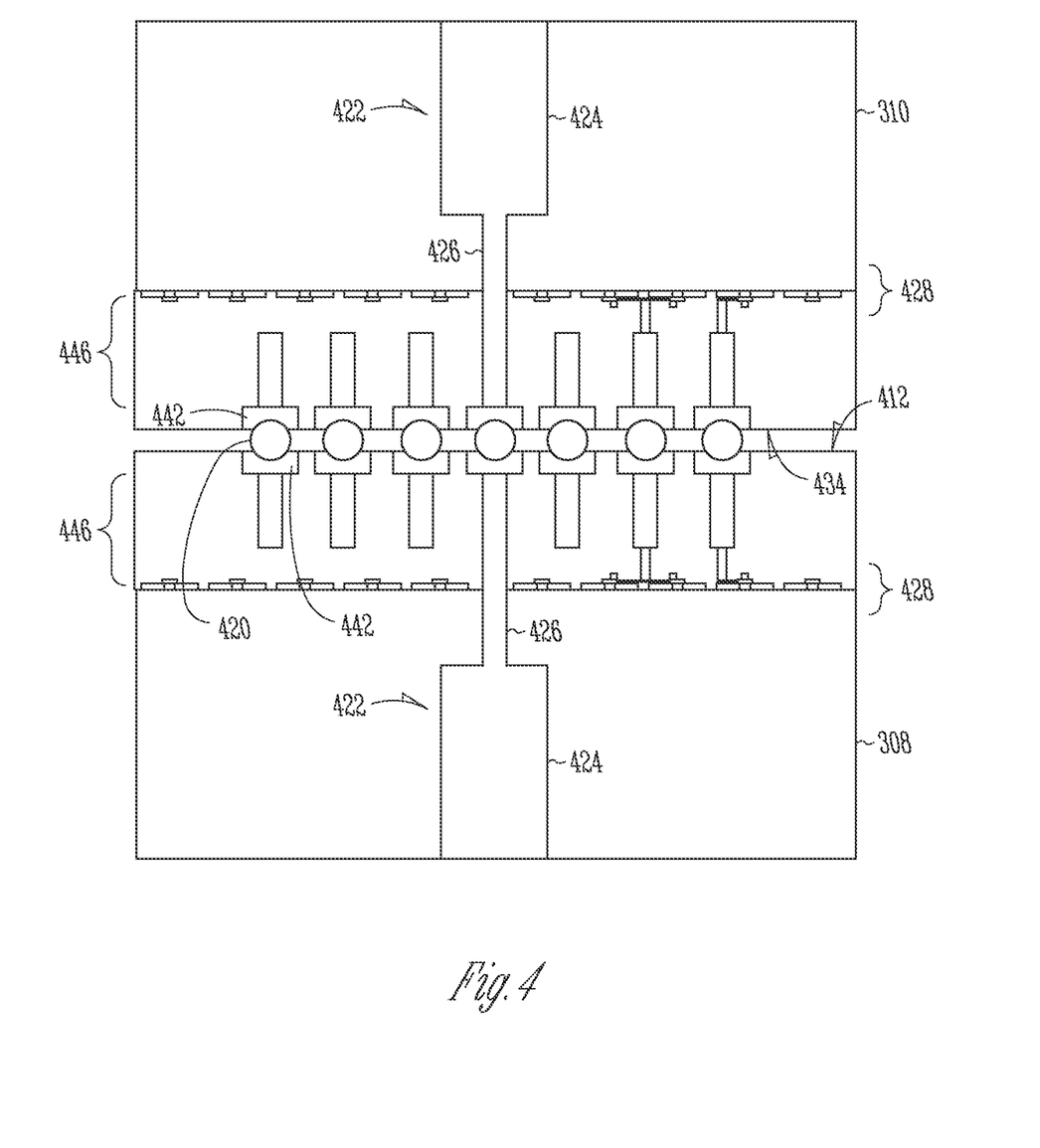
FIG. 4 is a blowup illustration of portions of the base IC die and second IC die of FIG. 3 in accordance with some embodiments.

FIG. 4 is a blowup illustration of portions of the base IC die 308 and second IC die 310 of FIG. 3 including stacked TSVs 422. Each of the TSVs includes a first BSV portion 424 and second BSV portion 426. The width of the second BSV portion is less than the width of the first BSV portion, and the second BSV portion extends through an active device layer 428 and through metal and via layers 446. The second TSV portion extends to the bonding pads 442 of bonding pad surface 412 and bonding pad surface 434. The bonding pads of the IC dies are coupled by solder bumps 420.

Figure 5:
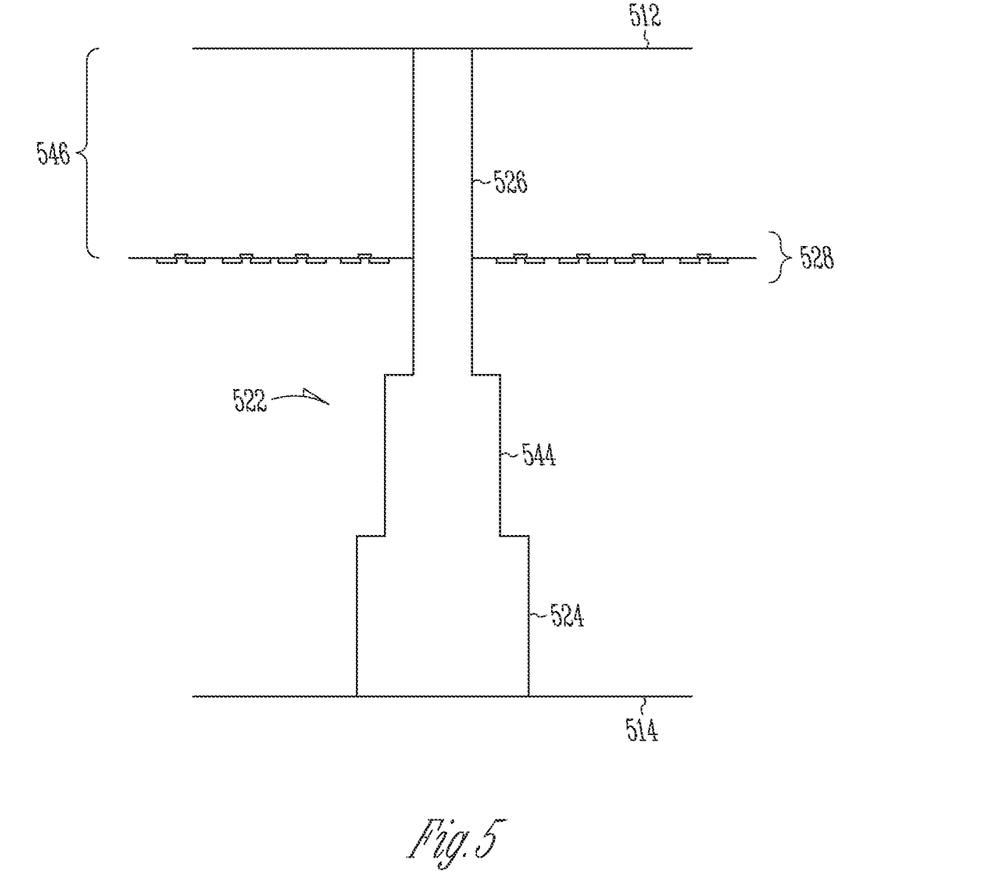
FIG. 5 is an illustration of a stacked TSV in accordance with some embodiments.

FIG. 5 is an illustration of another stacked TSV 522. A stacked TSV is not limited to just one change in width size. The stacked TSV 522 includes a first BSV portion 524 and a second BSV portion 526. The stacked TSV 522 includes a third intermediate BSV portion 544 between the first BSV portion 524 and the second BSV portion 526. The width of the third BSV portion is smaller than the width of the first BSV portion 524 and larger than the width of the second BSV portion 526. In certain aspects, the width of the third BSV portion is nearer to the width of the second BSV portion than the width of the first BSV portion. It can be seen that the stacked TSV 522 includes three BSV portions with two changes in width size. In some aspects, the stacked TSV includes more than two changes in width size. In some aspects, the first BSV portion 524, the second BSV portion 526, and the third intermediate BSV portion 544 comprise similar electrically conductive material. For example, the three portions may all include one of copper, tungsten, aluminum, silver, gold, tin-silver or tin-silver copper composites. In some aspects, the first BSV portion 524, the second BSV portion 526 and the third intermediate BSV portion 544 comprise different electrically conductive material. For example, the first BSV portion 524 may comprise copper metal, the second BSV portion 526 may comprise tungsten metal, and the third intermediate BSV portion 544 may comprise tin-silver composites.

Figure 6A:
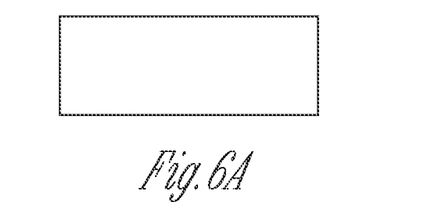
FIGS. 6A-6I is a flow diagram of a method of forming an electronic device in accordance with some embodiments.
Figure 6B:
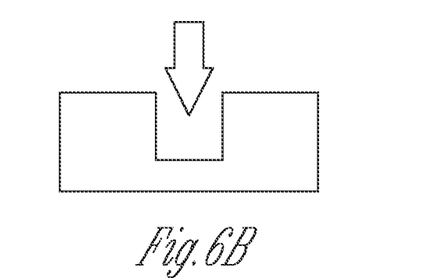

FIGS. 6A-6I is a flow diagram of a method of forming an electronic device, such as a 3D IC package for example. FIG. 6A is an illustration of bulk silicon. The bulk silicon can be a portion of a bulk silicon substrate. In FIG. 6B, a first portion of a cavity is formed in the bulk silicon. The first portion can be formed from the backside of a bulk silicon substrate. The first portion can be formed by silicon drilling (e.g., one or more of mechanical drilling, laser drilling, or ultra-violet laser drilling), or silicon etching. Because laser drilling typically evaporates the material being worked it can provide a cleaner cavity without material cracking or melting. In some aspects, the depth of the first portion of the cavity ranges from 50% to about 95% of the thickness of the bulk silicon substrate. Preferably, the depth of the first portion of the cavity is formed to within 5-10 micrometers (μm) of the active device layer. This vertical separation prevents the performance of transistors or other devices from being adversely affected. The first portion of the cavity has a first width. The first portion of the cavity will be used to form the first BSV portion of a stacked TSV. Multiple TSVs may be formed in the bulk silicon, and multiple cavities may be formed in the bulk silicon for the multiple TSVs.

Figure 6C:
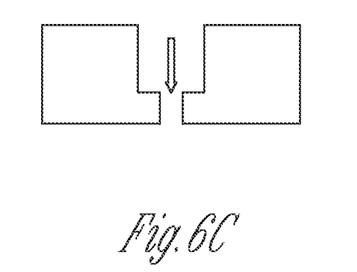
Figure 6D:
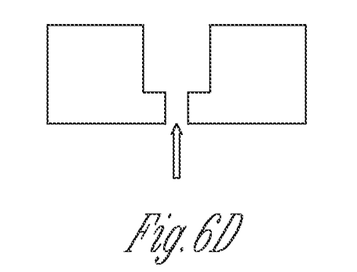

In FIGS. 6C and 6D, a second portion of the cavity is formed. The second portion of the cavity has a second width less than the first width of the first portion. In FIG. 6C, the second portion of the cavity is formed by a second silicon drilling. In FIG. 6D, the second portion of the cavity is formed by a second silicon etching from the other side (e.g., a front side) of the bulk silicon. In some aspects, the depth or height of the second portion of the cavity ranges from about 5% to 50% of the thickness of the bulk silicon substrate. In some aspects, the second portion of the cavity has a separation of 1-10 μm from the active device layer in the horizontal direction so that the transistor or device performance will not be adversely affected.

Figure 6E:
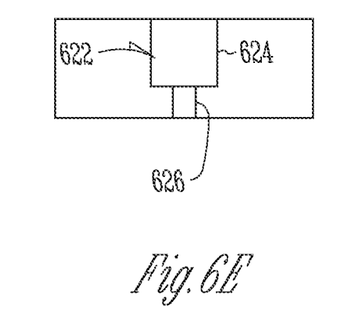

In FIG. 6B, the first portion of the cavity can be filled with an electrically conductive material before the second portion is formed. In FIG. 6E, the second portion of the cavity can be filled with an electrically conductive material to form a stacked TSV 622. In some aspects, the portions are filled with metal (e.g., copper or aluminum), such as by using a plating process (e.g., an electroless or electrolytic plating process). In the example of FIG. 6E, the stacked TSV includes a first BSV portion 624 having a first width, and a second BSV portion 626 having a second width less than the first width. In certain aspects, the second filling process may include a different material than the first filling process. For example, the first BSV portion can include copper and the second BSV portion can include tungsten. In some aspects, the first cavity portions and the second cavity portion are both formed and then filled with the electrically conductive material to form the stacked TSV 622. If the first BSV portion and the second BSV portion are filled individually, one or both of an electroplating process and a solder reflow process can be used to electrically and physically connect the individual BSV portions.

Figure 6F:
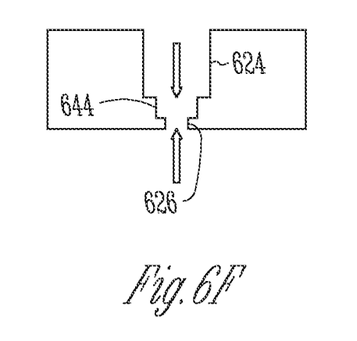

As explained above, the stacked TSV can include more than two BSV portions. In FIG. 6F, a third portion 644 of the cavity is formed using silicon drilling. When filled with the electrically conductive material, the third portion forms a third BSV portion, such as shown in the example of FIG. 5.

The shape of the BSV portions can be substantially cylindrical and the width of a portion can correspond to a diameter. The shape of the BSV portions can be substantially rectangular cuboidal and can be formed as a trench. The shape of the BSV portions can be substantially prismatic. In some aspects, the walls of the BSV portions can be tapered and the shape of the BSV portions can be substantially trapezoidal or truncated-conical.

Figure 6G:
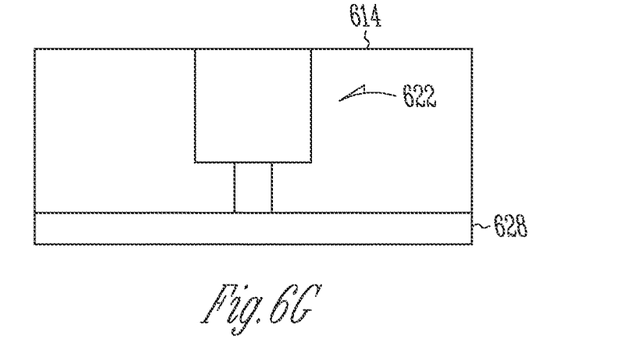

In FIG. 6G, an active device layer 628 is formed in a surface of the silicon substrate opposite the backside surface 614 of the silicon substrate. In some aspects, the active device layer 628 is formed after the cavity filling of FIG. 6E. A stack of metal and via layers can be disposed on the active device layer, and a bonding pad surface can be disposed on the stack of metal and via layers. Because the stacked TSV is formed before the active devices, this can be referred to as a TSV-first fabrication process. In some aspects, the active device layer 628 can be formed before the drilling of FIG. 6B. This can be referred to as a TSV-last fabrication process. The stacked TSV can also be formed after the active device layer 628 and in between formation of the stack of metal and via layers. This can be referred to as a TSV-middle fabrication process. In some aspects, the active device layer 628 can be formed after the cavity filling of FIG. 6E. The stack of metal and via layers can be disposed on the active device layer, and a bonding pad surface can be disposed on the metal and via layer.

Figure 6H:
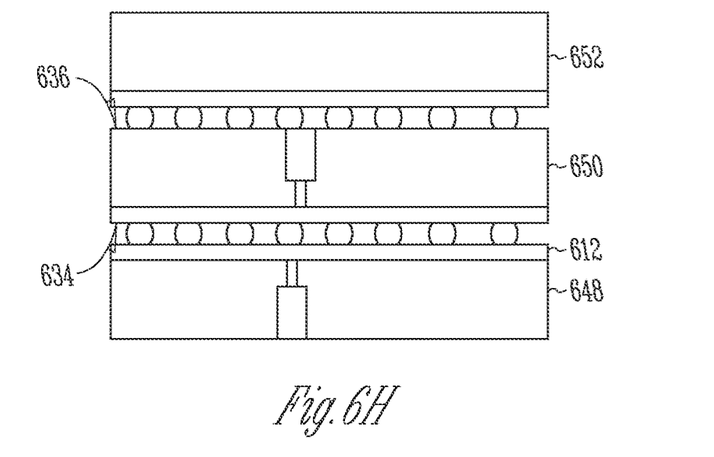

In FIG. 6H, additional silicon substrates are stacked and bonded to the first silicon substrate 648. This can be performed at the wafer level using a wafer bonding process. A second silicon substrate 650 is arranged on the first silicon substrate 648. The second silicon substrate includes a bonding pad surface 634 and a backside surface 636 and at least one stacked TSV extending between the backside surface and the bonding pad surface. The bonding pad surface 634 of the second silicon substrate 650 is coupled to the bonding pad surface 612 of the first silicon substrate 648. At this point, the bonded wafers can be separated into stacked IC die.

Instead, of separating the bonded wafers, a third silicon substrate 652 can be arranged onto the backside of the second silicon substrate. The three bonded wafers can then be separated into assemblies of three stacked IC die.

Figure 6I:
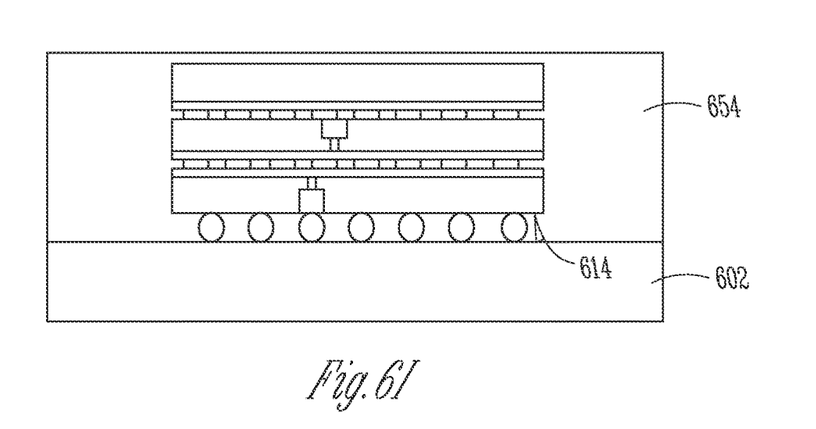

In FIG. 6I, the backside surface 614 of an IC die of the first silicon substrate 648 is coupled to a package substrate 602 using solder bumps. In some aspects, this can include surface mounting of the stacked IC die and solder reflowing. A mold-underfill (MUF) layer 654 can be applied to the mounted stacked die using a dispensing or injection process.

An example of an electronic device using assemblies with system level packaging as described in the present disclosure is included to show an example of a higher level device application.

Figure 7:
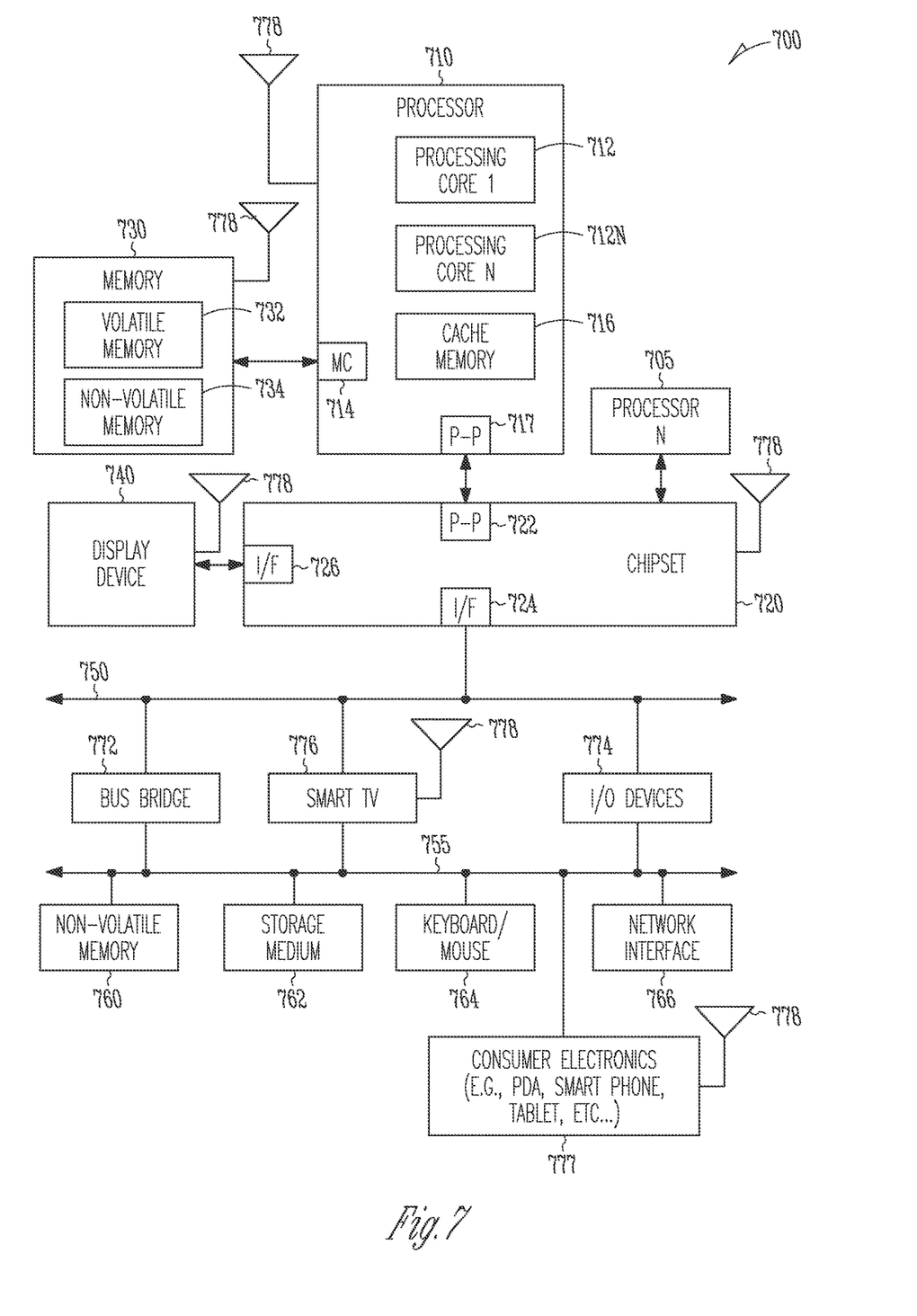
FIG. 7 illustrates a system level diagram in accordance with some embodiments.

FIG. 7 illustrates a system level diagram, according to one embodiment of the invention. For instance, FIG. 7 depicts an example of an electronic device (e.g., system) that can include one or more of the stacked TSVs as described in the present disclosure. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system. In one example, two or more systems as shown in FIG. 7 may be coupled together using one or more stacked TSVs as described in the present disclosure.

In one embodiment, processor 710 has one or more processing cores 712 and 712N, where N is a positive integer and 712N represents the Nth processor core inside processor 710. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchical structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAIVIBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the invention, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices 772, 776, 774, 760, 762, 764, 766, 777, etc. Buses 750 and 755 may be interconnected together via a bus bridge 772. Chipset 720 connects to one or more buses 750 and 755 that interconnect various elements 774, 760, 762, 764, and 766. Chipset 720 may also be coupled to a wireless antenna 778 to communicate with any device configured to transmit and/or receive wireless signals. Chipset 720 connects to display device 740 via interface (I/F) 726. Display 740 may be, for example, a liquid crystal display (LCD), a plasma display, cathode ray tube (CRT) display, or any other form of visual display device. In some embodiments of the invention, processor 710 and chipset 720 are merged into a single SOC. In one embodiment, chipset 720 couples with (e.g., via interface 724) a non-volatile memory 760, a mass storage medium 762, a keyboard/mouse 764, and a network interface 766 via I/F 724 and/or I/F 726, I/O devices 774, smart TV 776, consumer electronics 777 (e.g., PDA, Smart Phone, Tablet, etc.).

In one embodiment, mass storage medium 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

The devices, systems, and methods described can provide improved routing of interconnection between ICs for a multichip package in addition to providing improved transistor density in the IC die. Examples described herein include two or three IC dies for simplicity, but one skilled in the art would recognize upon reading this description that the examples can include more than three IC dies.

ADDITIONAL DESCRIPTION AND EXAMPLES

Example 1 includes subject matter (such as an electronic device) comprising a first IC die. The IC die includes a first bonding pad surface, and a first backside surface opposite the first bonding pad surface; a first active device layer arranged between the first bonding pad surface and the first backside surface; and at least one stacked through silicon via (TSV) disposed between the first backside surface and the first bonding pad surface, wherein the at least one stacked TSV includes a first buried silicon via (BSV) portion having a first width and a second BSV portion having a second width smaller than the first width, and wherein the first BSV portion extends to the first backside surface and the second BSV portion extends to the first active device layer.

In Example 2, the subject matter of Example 1 optionally includes a package substrate and a second IC die. The first backside surface of the first IC die is coupled to the package substrate, and the second IC die includes a second bonding pad surface and a second backside surface opposite the second bonding pad surface, wherein the second IC die is arranged on the first IC die with the second bonding pad surface facing the first bonding pad surface, and the second BSV portion of the stacked TSV is in electrical contact with the first bonding pad surface of the first IC die.

In Example 3, the subject matter of Example 2 optionally includes the second IC die including at least one stacked TSV disposed between the second backside surface and the second bonding pad surface, wherein the at least one stacked TSV of the second die includes a first BSV portion that extends to the second backside surface and a second BSV portion that has a width smaller than a width of the first BSV portion.

In Example 4, the subject matter of one or both of Examples 2 and 3 optionally includes a third IC die coupled by solder bumps to the second backside surface of the second IC die.

In Example 5, the subject matter of one or any combination of Examples 1-4 optionally includes the first IC die including metal layers and via layers, and the second BSV portion extends through the metal layers and via layers.

In Example 6, the subject matter of one or any combination of Example 1-5 optionally includes the first active device layer includes a plurality of transistors.

In Example 7, the subject matter of one or any combination of Examples 1-6 optionally includes a the stacked TSV including a third intermediate BSV portion between the first BSV portion and the second BSV portion, wherein a width of the third BSV portion is smaller than the width of the first BSV portion and larger than the width of the second BSV portion.

In Example 8, the subject matter of one or any combination of Examples 1-7 optionally includes a second BSV portion of a stacked TSV that extends through the first active device layer to the first bonding pad surface.

In Example 9, the subject matter of one or any combination of Examples 1-8 optionally includes the first bonding pad surface of the first IC die coupled to the second bonding pad surface of the second IC die using a plurality of solder bumps.

In Example 10, the subject matter of one or any combination of Examples 1-9 optionally includes the first IC die including metal layers and via layers. The first width of the first BSV portion corresponds to a first feature pitch size of the first backside surface, and the second width corresponds to a second feature pitch size of one of the first active device layer, the metal layers, or the via layers.

In Example 11, the subject matter of one or any combination of Examples 1-10 optionally includes the first BSV portion and the second BSV portion each including a substantially rectangular cuboidal shape.

In Example 12, the subject matter of one or any combination of Examples 1-10 optionally includes the first BSV portion and the second BSV portion each a substantially cylindrical shape.

In Example 13, the subject matter of one or any combination of Examples 1-10 optionally includes the first BSV portion and the second BSV portion both include one of a substantially trapezoidal shape, a substantially conical shape, or a substantially prismatic shape.

Example 14 includes subject matter (such as a method of forming an electronic device), or can optionally be combined with one or any combination of Examples 1-13 to include such subject matter, comprising forming a first cavity in a backside surface of a first silicon substrate, wherein the first portion has a first width; filling the first cavity with an electrically conductive material to form a first buried silicon via (BSV) portion of a stacked through silicon via (TSV); forming a second cavity, wherein the second cavity includes a second width less than the first width; filling the second cavity with the electrically conductive material to form a second BSV portion of the stacked TSV;

electrically connecting the first BSV portion and the second BSV portion using one or both of an electroplating process or a solder reflow process; and forming an active device layer in the first silicon substrate.

In Example 15, the subject matter of Example 14 optionally includes forming a third cavity prior to forming the second cavity, wherein the third cavity includes a third width less than the first width and greater than the second width; and filling the third cavity with the electrically conductive material to form a third portion of the stacked TSV, wherein the one or both of the electroplating process or the solder reflow process electrically connects the first, second, and third BSV portions of the stacked TSV.

In Example 16, the subject matter of one or both of Examples 14 and 15 optionally includes arranging a second silicon substrate on the first silicon substrate, wherein the second silicon substrate includes a bonding pad surface and a backside surface and at least one stacked TSV disposed between the backside surface and the bonding pad surface, and the bonding pad surface of the second silicon substrate is coupled to the bonding pad surface of the first silicon substrate; and separating the first and second silicon substrates into stacked integrated circuit (IC) die.

In Example 17, the subject matter of Example 16 optionally includes arranging a third silicon substrate onto the backside of the second silicon substrate, and wherein separating the first and second silicon substrates includes separating the first, second, and third silicon substrates into stacked IC die.

In Example 18, the subject matter of one or both of Examples 16 and 17 optionally includes coupling a backside surface of an IC die of the first silicon substrate to a package substrate using solder bumps.

In Example 19, the subject matter of one or any combination of Examples 14-18 optionally includes forming the first and second cavities using one or more of laser drilling, ultra-violet laser drilling, mechanical drilling, and etching.

In Example 20, the subject matter of Example 19 optionally includes performing the one or more of laser drilling, ultra-violet laser drilling, mechanical drilling, and etching for the second cavity after the first portion of the cavity is filled with the electrically conductive material.

Example 21 includes subject matter (such as an electronic device), or can optionally be combined with one or any combination of Examples 1-20 to include such subject matter, comprising a package substrate, a first IC die arranged on the package substrate and a second IC die arranged on the first IC die. The first IC die includes a first bonding pad surface and a first backside surface opposite the first bonding pad surface and the first backside surface coupled to the package substrate; an active device layer arranged between the first bonding pad surface and the first backside surface, and including a plurality of transistor devices; and at least one stacked through silicon via (TSV) disposed between the first backside surface and the first bonding pad surface. The at least one stacked TSV includes a first buried silicon via (BSV) portion having a first diameter and a second BSV portion having a second diameter smaller than the first diameter, and the first BSV portion extends to the first backside surface, and the second BSV portion extends to the active device layer. The second IC die includes a second bonding pad surface and a second backside surface opposite the second bonding pad surface, wherein the second bonding pad surface is coupled to the first bonding pad surface.

In Example 22, the subject matter of Example 21 optionally includes a third IC die arranged on the second IC die and coupled to the second backside surface, wherein the second IC die includes at least one stacked TSV disposed between the second backside surface and the second bonding pad surface, wherein the at least one stacked TSV of the second die includes a first BSV portion that extends to the second backside surface and a second BSV portion that has a diameter smaller than a diameter of the first BSV portion.

In Example 23, the subject matter of one or both of Examples 21 and 22 optionally includes the stacked TSV of the first IC die extending from the first backside surface through the active device layer to the first bonding pad surface.

These non-limiting examples can be combined in any permutation or combination. The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An integrated circuit (IC) package, comprising:
   a package substrate;
   a base IC die coupled to the package substrate, the base IC die comprising:
   a silicon substrate having an active device layer and a backside surface opposite the active device layer;
   a plurality of metal layers above the active device layer, the plurality of metal layers comprising an uppermost metal layer, a second to uppermost metal layer below the uppermost layer, a third to uppermost metal layer below the second to uppermost metal layer, and a fourth to uppermost metal layer below the third to uppermost metal layer;
   a through silicon via (TSV) extending through the silicon substrate, through the active device layer, and through the fourth to uppermost metal layer, the TSV having a top surface below the third to uppermost metal layer, and the TSV having a first width where the TSV extends through the active device layer, and a second width in the silicon substrate, the second width greater than the first width; and
   a via between and in contact with the top surface of the TSV and an interconnect of the third to uppermost metal layer; and
   a microbump coupled to an interconnect of the uppermost metal layer.

2. The IC package of claim 1, wherein the second width in the silicon substrate is proximate to the backside surface of the silicon substrate.

3. The IC package of claim 1, wherein the second width in the silicon substrate is at a midpoint of the silicon substrate, the midpoint between the active device layer and the backside surface.

4. The IC package of claim 1, further comprising:
   a top die coupled to the base die.

5. The IC package of claim 1, wherein the TSV has a third width at a location in the silicon substrate, the third width less than the second width.

6. The IC package of claim 1, further comprising:
   a keep-out-region along sides of the TSV.

7. The IC package of claim 1, wherein the TSV comprises copper.

8. An integrated circuit (IC) package, comprising:
   a package substrate;
   a base IC die coupled to the package substrate, the base IC die comprising:

a silicon substrate having an active device layer and a backside surface opposite the active device layer;

a plurality of metal layers above the active device layer, the plurality of metal layers comprising a topmost metal layer and a bottommost metal layer;

a through silicon via (TSV) extending through the silicon substrate, through the active device layer, and to a location between the uppermost metal layer and the bottommost metal layer, the TSV having a first width where the TSV extends through the active device layer, and a second width in the silicon substrate, the second width greater than the first width; and a via between and in contact with a top surface of the TSV and a metal layer between the uppermost metal layer and the bottommost metal layer; and a microbump coupled to an interconnect of the uppermost metal layer.

9. The IC package of claim 8, wherein the second width in the silicon substrate is proximate to the backside surface of the silicon substrate.

10. The IC package of claim 8, wherein the second width in the silicon substrate is at a midpoint of the silicon substrate, the midpoint between the active device layer and the backside surface.

11. The IC package of claim 8, further comprising:
a top die coupled to the base die.

12. The IC package of claim 8, wherein the TSV has a third width at a location in the silicon substrate, the third width less than the second width.

13. The IC package of claim 8, further comprising:
a keep-out-region along sides of the TSV.

14. The IC package of claim 8, wherein the TSV comprises copper.

15. A system, comprising:
a package substrate;
a base IC die coupled to the package substrate, the base IC die comprising:
a silicon substrate having an active device layer and a backside surface opposite the active device layer;
a plurality of metal layers above the active device layer, the plurality of metal layers comprising an uppermost metal layer, a second to uppermost metal layer below the uppermost layer, a third to uppermost metal layer below the second to uppermost metal layer, and a fourth to uppermost metal layer below the third to uppermost metal layer;
a through silicon via (TSV) extending through the silicon substrate, through the active device layer, and through the fourth to uppermost metal layer, the TSV having a top surface below the third to uppermost metal layer, and the TSV having a first width where the TSV extends through the active device layer, and a second width in the silicon substrate, the second width greater than the first width; and
a via between and in contact with the top surface of the TSV and an interconnect of the third to uppermost metal layer;
a microbump coupled to an interconnect of the uppermost metal layer;
a top die coupled to the base die;
a plurality of solder balls coupled to a side of the package substrate opposite the base IC die; and
a plurality of passive electronic components coupled to the side of the package substrate opposite the base IC die.

16. The system of claim 15, wherein the second width in the silicon substrate is proximate to the backside surface of the silicon substrate.

17. The system of claim 15, wherein the second width in the silicon substrate is at a midpoint of the silicon substrate, the midpoint between the active device layer and the backside surface.

18. The system of claim 15, wherein the TSV has a third width at a location in the silicon substrate, the third width less than the second width.

19. The system of claim 15, further comprising:
a keep-out-region along sides of the TSV.

20. The system of claim 15, wherein the TSV comprises copper.

* * * * *